(12) United States Patent
Maeda et al.

(10) Patent No.: US 6,441,448 B1
(45) Date of Patent: *Aug. 27, 2002

(54) SEMICONDUCTOR STORAGE DEVICE

(75) Inventors: Shigenobu Maeda; Yasuo Yamaguchi; Hirotada Kuriyama, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/289,719

(22) Filed: Apr. 12, 1999

(30) Foreign Application Priority Data

Oct. 26, 1998 (JP) .......................... 10-304027

(51) Int. Cl.[7] .............................. H01L 29/76
(52) U.S. Cl. ..................... 257/392; 257/347; 257/350; 257/351
(58) Field of Search ................ 257/392, 368, 257/350, 351, 347, 369, 371, 372; 365/182, 154

(56) References Cited

U.S. PATENT DOCUMENTS

| | | | |
|---|---|---|---|
| 5,166,902 A | | 11/1992 | Silver |
| 5,859,466 A | * | 1/1999 | Wada .......................... 257/508 |
| 6,005,797 A | * | 12/1999 | Porter ......................... 257/392 |
| 6,040,610 A | * | 3/2000 | Noguchi ...................... 257/392 |
| 6,091,630 A | * | 7/2000 | Chan .......................... 257/156 |
| 6,121,662 A | * | 9/2000 | Wu ............................. 257/369 |
| 6,198,134 B1 | * | 3/2001 | Inoue et al. ................. 257/351 |

OTHER PUBLICATIONS

"CAD–Compatible High–Speed CMOS/SIMOX Technology Using Field–Shield Isolation for 1M Gate Array", T. Iwamatsu et al., International Electron Devices Meeting Technical Digest, Dec. 1993, pp. 475–478.

* cited by examiner

*Primary Examiner*—Olik Chaudhuri
*Assistant Examiner*—Nathan W. Ha
(74) *Attorney, Agent, or Firm*—McDermott, Will & Emery

(57) ABSTRACT

A memory cell which is capable of reducing the memory cell size in SRAM using a field-shield isolation on an SOI substrate. An isolation oxide film is provided between a field-shield isolation plate for n-type transistors and a field-shield isolation plate for p-type transistors.

4 Claims, 14 Drawing Sheets

US 6,441,448 B1

SEMICONDUCTOR STORAGE DEVICE

BACKGROUND OF THE INVENTION

1. Field of the Invention

The present invention relates to a static semiconductor storage device (hereinafter referred to as SRAM) using field-shield isolation.

2. Description of Related Art

In general, an SRAM memory cell is constituted of six transistors. FIG. 13 is an equivalent circuit diagram of an SRAM memory cell. In FIG. 13, reference symbols 1a and 1b denote access transistors each being an n-type transistor; 2a and 2b, driver transistors each being an n-type transistor; 3a and 3b, load transistors each being a p-type transistor; 4a and 4b, bit lines; and 5, a word line. In the memory cell, the driver transistors 2a and 2b and the load transistors 3a and 3b form a flip-flop circuit.

FIGS. 14 and 15 show patterns of a related SRAM memory cell in which polysilicon interconnections in one level and metal interconnections in two levels and field-shield isolation plates are used on an SOI (silicon on insulator) substrate. Specifically, FIG. 14 shows a pattern of field-shield isolation plates, active regions, polysilicon interconnections, first-level metal interconnections, and first contact portions that connect the first-level metal interconnections to the polysilicon interconnections or the active regions. FIG. 15 shows a pattern of the field-shield isolation plates, the active regions, the polysilicon interconnections, second-level metal interconnections, and second contact portions that connect the second-level metal interconnections to the active regions or the field-shield isolation plates. The term "field-shield isolation" as used in this specification means, in simple terms, device isolation that utilizes off-states of MOS transistors having a high threshold voltage. The term "field-shield isolation plate" corresponds to the gate of an ordinary transistor. In the following description, the field-shield isolation will be explained in a case where it is effected by field-shield isolation plates.

To reduce the resistivity of active regions on an SOI substrate, usually the surface portions of the active regions are converted to a refractory metal silicide.

In the related SRAM memory cell pattern of FIG. 14, 11a–11c denote field-shield isolation plates for n-type transistors; 11d, a field-shield isolation plate for p-type transistors; 12a–12f, n-type active regions; 12g–12j, p-type active regions; 12x–12z, active regions that are not clearly judged to be of an n-type or of a p-type; and 13a–13c, polysilicon interconnections or interconnections having a laminated structure of polysilicon and a silicide (hereinafter represented by polysilicon interconnections). Reference symbols 14a–14c denote first-level metal interconnections, and 15a–15h denote first contact portions that connect the first-level metal interconnections to the active regions or the polysilicon interconnections.

In FIG. 15, reference symbols 16a–16d denote second-level metal interconnections, and 17a–17f denote second contact portions that connect the second-level metal interconnections to the active regions or the field-shield isolation plates.

Next, the components shown in the equivalent circuit diagram of FIG. 13 will be correlated with the parts shown in FIGS. 14 and 15. As for the access transistors, for the sake of convenience, the active regions connected to the bit lines will be called drain active regions and the active regions connected to the driver transistors will be called source active regions. First, as for the transistors, the drain active region, the gate, and the source active region of the access transistor 1a are the parts 12a, 13a, and 12b, respectively; those of the access transistor 1b are the parts 12d, 13a, and 12e, respectively; those of the driver transistor 2a are the parts 12b, 13b, and 12c, respectively; those of the driver transistor 2b are the parts 12e, 13c, and 12f; those of the load transistor 3a are the parts 12g, 13b, and 12h; and those of the load transistor 3b are the parts 12i, 13c, and 12j. The bit line 4a corresponds to the part 16a, the bit line 4b corresponds to the part 16b, and the word line 5 corresponds to the part 13a. The part 14c in FIG. 14 corresponds to the Vcc interconnection and the parts 16c and 16d in FIG. 15 correspond to the GND interconnection.

FIG. 16 is a sectional view taken along line I—I in FIGS. 14 and 15. In FIG. 16, reference symbols 21–23 denote a silicon portion, an insulating layer, and an interlayer insulating film, respectively.

The above-described SRAM formed on the SOI substrate by using the field-shield isolation have the following three problems.

The first problem is data destruction at storage nodes that occurs being influenced by floating potential regions. In FIG. 14, although the active regions 12x–12z are divided from each other by the field-shield isolation plates 11b and 11d and the polysilicon interconnections 13b and 13c, their potentials are not fixed. Therefore, the active regions 12x–12z are rendered in a floating potential state and influence the active regions 12b, 12e, 12g, and 12i as storage node portions in memory cell operation, and possibly cause data destruction through noise, latch-up, or the like.

The second problem is a large memory cell size. As shown in FIG. 14, the potentials of the field-shield isolation plate 11b for n-type transistors and the field-shield isolation plate 11d for p-type transistors are fixed at the GND potential and the Vcc potential, respectively. Therefore, intervals are needed between the n-type transistors and the p-type transistors. Specifically, if each of a minimum field-shield isolation width (or a minimum polysilicon interconnection width) and a minimum isolation interval (or a minimum polysilicon interval) is W, it is desirable that an interval X between the same storage nodes (see FIG. 14) be equal to 3W. However, actually, since the active regions 12x–12z between the n-type transistors and the p-type transistors are electrically unstable (the first problem mentioned above), there may occur latch-up or the like. For this reason, to make the memory cell less prone to data destruction, the interval X between the same storage nodes is set at a large value 3W+α. This necessarily increases the memory cell size.

The third problem is severe hole forming conditions of the second contact portions. FIG. 17 shows a pattern of field-shield isolation plates in a case where related memory cells 40 as shown in FIGS. 14 and 15 are arranged in a 4×4 (vertical/horizontal) array. Where the field-shield isolation plates 11b and 11d are arranged in array form, they assume a continuous pattern and hence the plate potentials can be fixed at ends of the array.

On the other hand, where the field-shield isolation plates 11a and 11c are solitary patterns, the plate potentials need to be fixed at the respective positions. As shown in FIG. 15, it is necessary to fix the potentials by connecting the field-shield isolation plates 11a and 11c to the second-level metal interconnections 16d and 16c via the second contact portions 17d and 17c, respectively.

Therefore, as shown in FIG. 15, it is necessary to form, in the memory cell, two kinds of second contact portions having different depths, that is, the contact portions 17a, 17b, 17e, and 17f for the active regions and the contact portions 17c and 17d for field-shield isolation plates, which leads to severe contact hole opening conditions.

SUMMARY OF THE INVENTION

The present invention has been made to solve the above problems in the art, and a first object of the invention is therefore to eliminate floating potential active regions.

A second object of the invention is to reduce the memory cell size.

A third object of the invention is to realize a memory cell configuration in which second contact portions have only one kind of depth.

According to a first aspect of the present invention, there is provided a semiconductor storage device having a memory cell comprising: a first driver transistor; a second driver transistor; a first load transistor that forms a flip-flop circuit together with the first and the second driver transistors; a second load transistor that forms a flip-flop circuit together with the first and the second driver transistors; a first access transistor connected to a drain active region of the first driver transistor and a drain active region of the first load transistor; and a second access transistor connected to a drain active region of the second driver transistor and a drain active region of the second load transistor, wherein device isolation in the memory cell includes field-shield isolation, and isolation between active regions of the first driver transistor and active regions of the first load transistor and isolation between active regions of the second driver transistor and active regions of the second load transistor are effected by oxide film isolation.

According to a second aspect of the present invention, there is provided a semiconductor storage device having a memory cell comprising: a first driver transistor; a second driver transistor; a first load transistor that forms a flip-flop circuit together with the first and the second driver transistors; a second load transistor that forms a flip-flop circuit together with the first and the second driver transistors; a first access transistor connected to a drain active region of the first driver transistor and a drain active region of the first load transistor; and a second access transistor connected to a drain active region of the second driver transistor and a drain active region of the second load transistor, wherein device isolation in the memory cell includes field-shield isolation, and at least part of isolation regions that are in contact with the drain active regions of the first and the second driver transistors and the drain active regions of the first and the second load transistors are isolated by oxide film isolation.

According to a third aspect of the present invention, there is provided a semiconductor storage device having a memory cell comprising: a first driver transistor; a second driver transistor; a first load transistor that forms a flip-flop circuit together with the first and the second driver transistors; a second load transistor that forms a flip-flop circuit together with the first and the second driver transistors; a first access transistor connected to a drain active region of the first driver transistor and a drain active region of the first load transistor; and a second access transistor connected to a drain active region of the second driver transistor and a drain active region of the second load transistor, wherein device isolation in the memory cell includes field-shield isolation, active regions of the first access transistor and the drain active region of the first driver transistor are isolated from each other by field-shield isolation and connected to each other via a metal interconnection, and active regions of the second access transistor and the drain active region of the second driver transistor are isolated from each other by field-shield isolation and connected to each other via a metal interconnection.

According to a fourth aspect of the present invention, there is provided a semiconductor storage device having a memory cell comprising: a first driver transistor; a second driver transistor; a first load transistor that forms a flip-flop circuit together with the first and the second driver transistors; a second load transistor that forms a flip-flop circuit together with the first and the second driver transistors; a first access transistor connected to a drain active region of the first driver transistor and a drain active region of the first load transistor; and a second access transistor connected to a drain active region of the second driver transistor and a drain active region of the second load transistor, wherein device isolation in the memory cell includes field-shield isolation, first and second active regions of the first access transistor and active regions of the second access transistor are arranged substantially on a straight line, and a word line that is connected to the first and the second access transistors is formed on a portion of a field-shield isolation plate that is located between the first active region of the first access transistor and a source active region of the first driver transistor.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

Embodiments of the present invention will be described below with reference to the accompanying drawings. It is

Embodiment 1

Figure 1:
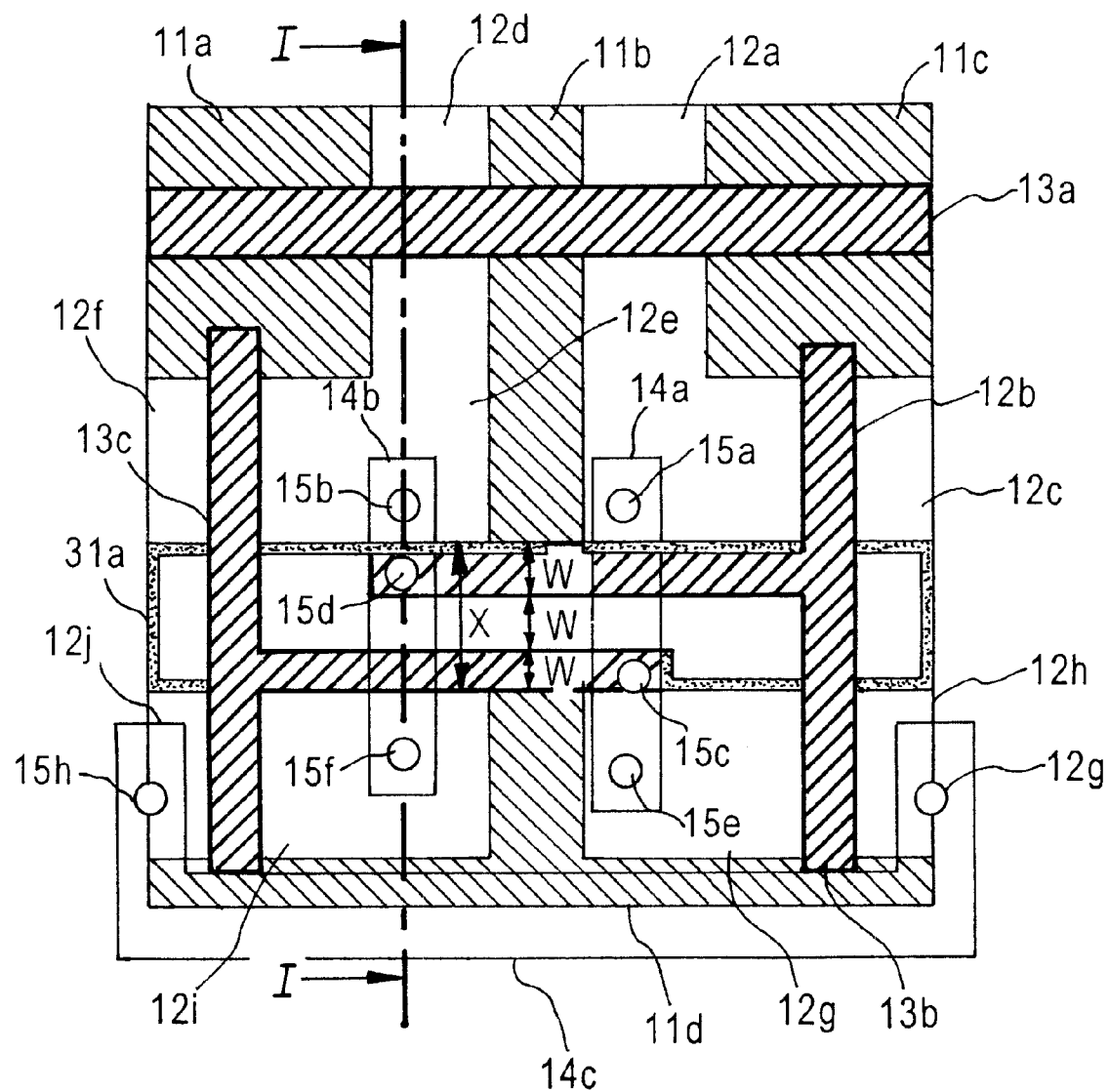
FIGS. 1 and 2 show patterns of an SRAM memory cell according to a embodiment 1 of the present invention.
Figure 2:
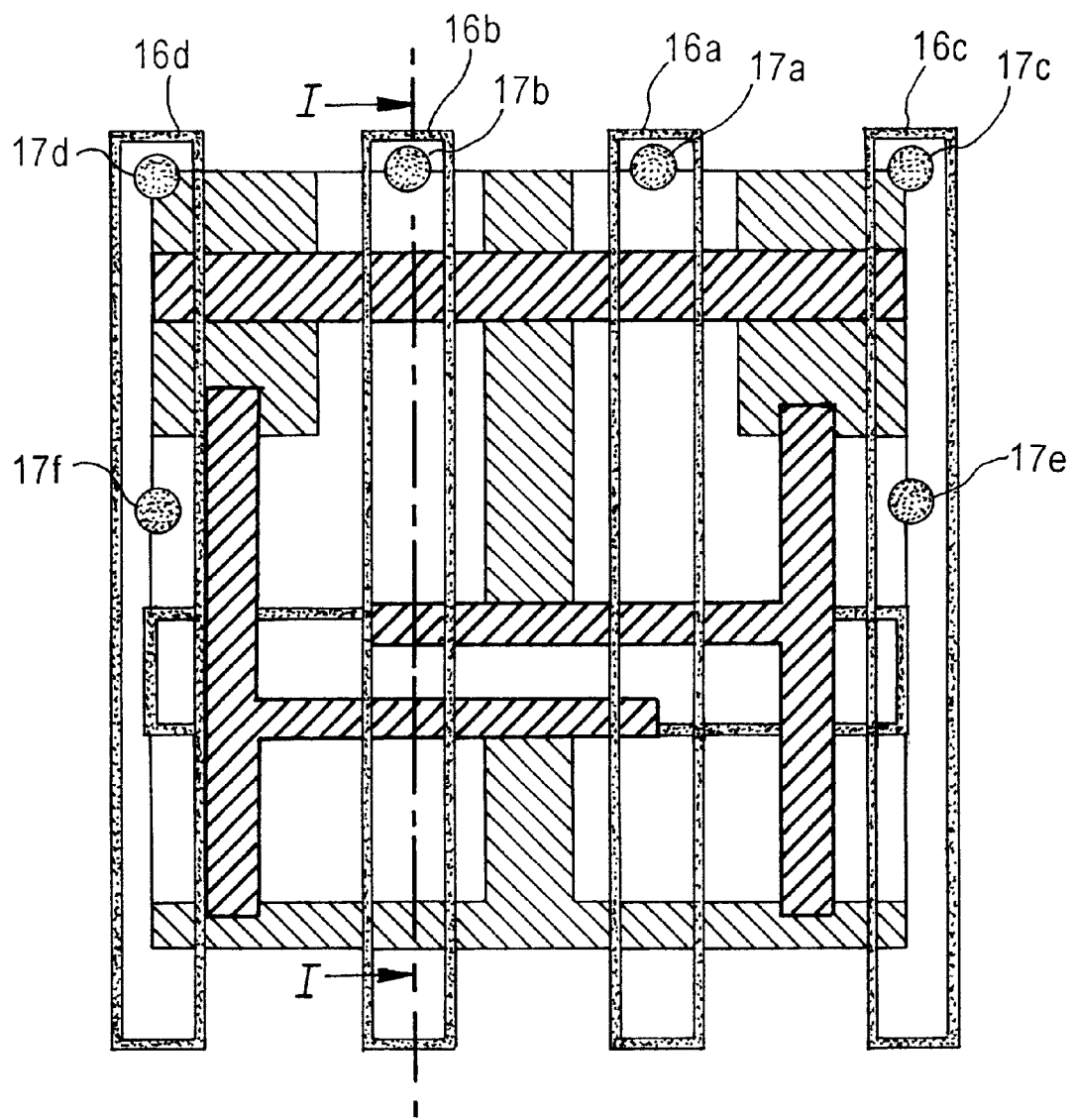

FIGS. 1 and 2 show patterns of an SRAM memory cell according to a embodiment 1 of the present invention. The memory cell is configured by polysilicon interconnections in one level and metal interconnections and field-shield isolation plates in two levels. Specifically, FIG. 1 shows a pattern of field-shield isolation plates, active regions, polysilicon interconnections, first-level metal interconnections, and first contact portions that connect the first-level metal interconnections to the polysilicon interconnections or the active regions. FIG. 2 shows a pattern of the field-shield isolation plates, the active regions, the polysilicon interconnections, second-level metal interconnections, and second contact portions that connect the second-level metal interconnections to the active regions or the field-shield isolation plates.

In FIG. 1, 11a–11c denote field-shield isolation plates for n-type transistors; 11d, a field-shield isolation plate for p-type transistors; 12a–12f, n-type active regions; 12g–12j, p-type active regions; and 13a–13c, polysilicon layers. Reference symbols 14a–14c denote first-level metal interconnections, and 15a–15g denote first contact portions that connect the first-level metal interconnections to the active regions or the polysilicon layers. Reference symbol 31a denotes an isolation oxide film.

In FIG. 2, reference symbols 16a–16d denote second-level metal interconnections, and 17a–17f denote second contact portions that connect the second-level metal interconnections to the active regions or the field-shield isolation plates.

Figure 13:
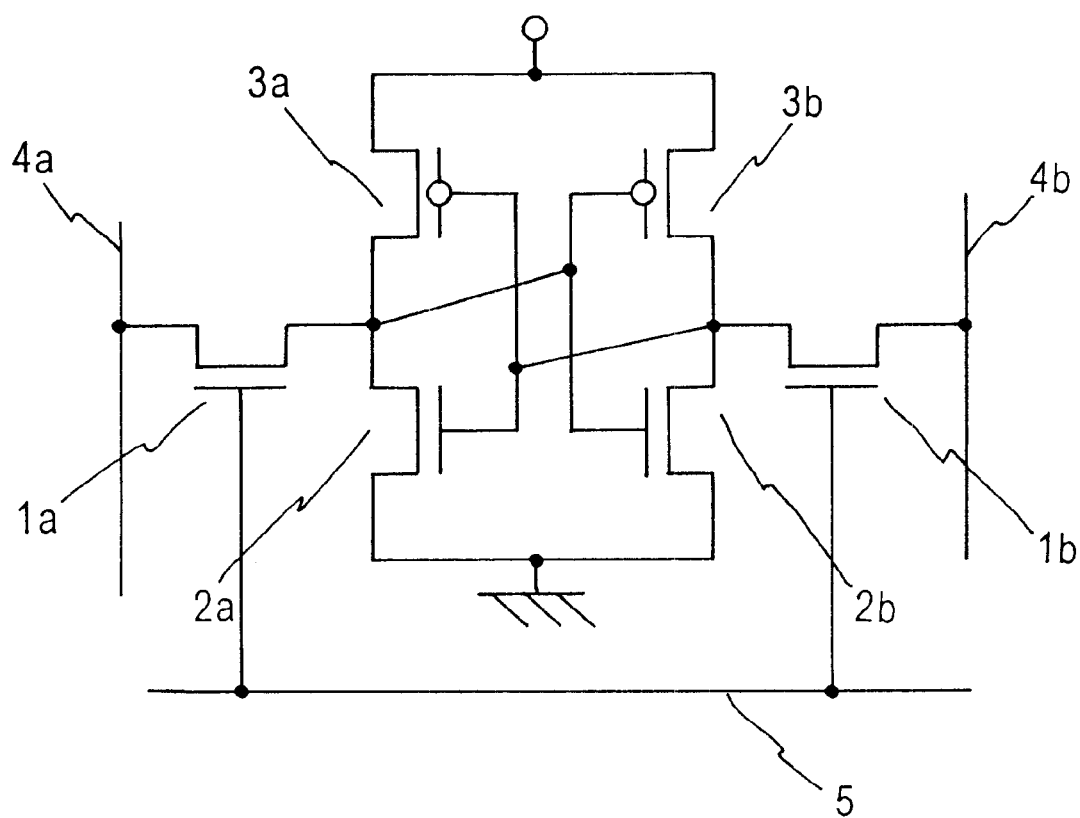
FIG. 13 is an equivalent circuit diagram of a related SRAM memory cell.
Figure 14:
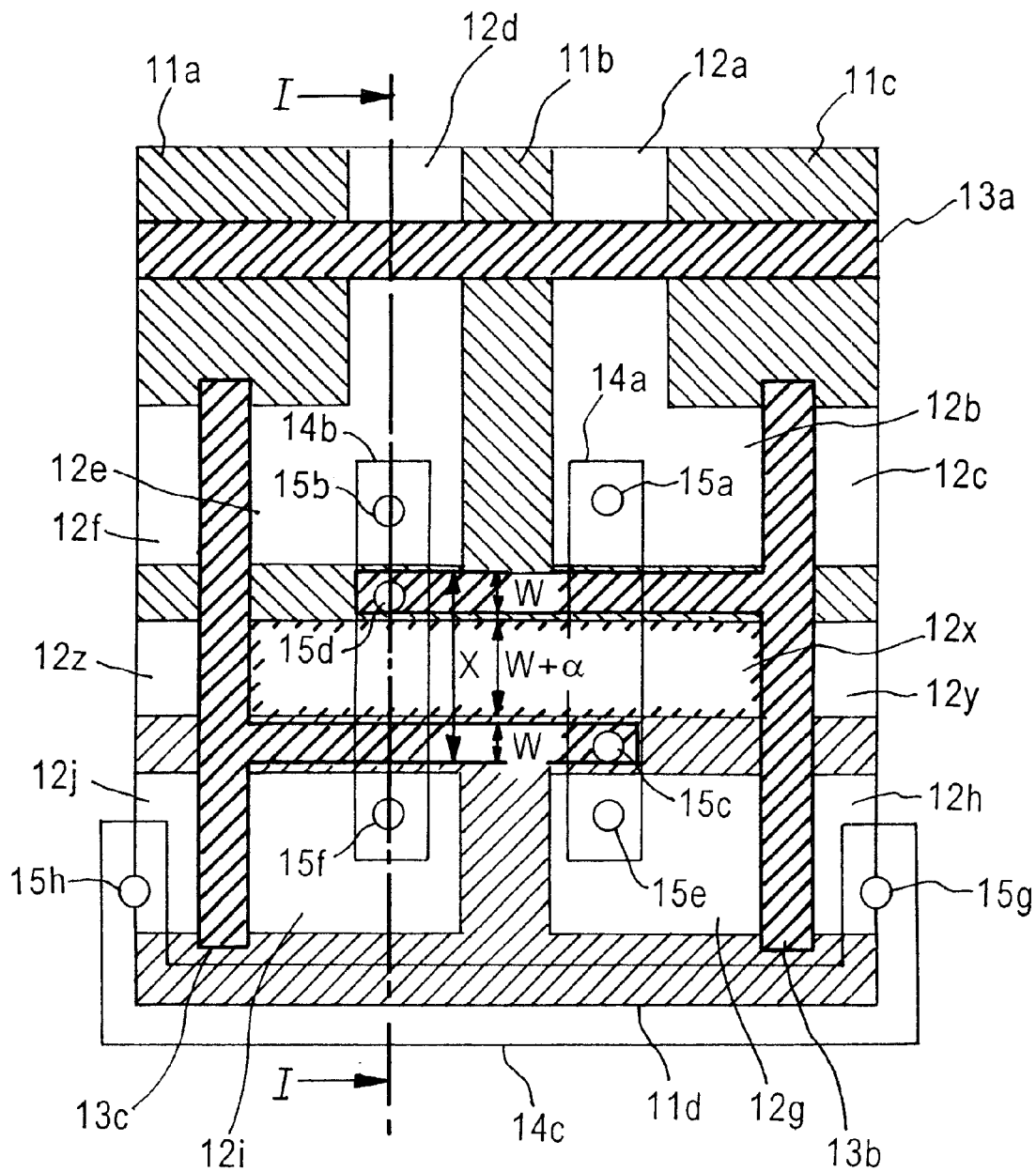
FIGS. 14 and 15 show patterns of a related SRAM memory cell in which polysilicon interconnections in one level and metal interconnections and field-shield isolation plates in two levels are used on an SOI (silicon on insulator) substrate.

Next, the components shown in the equivalent circuit diagram of FIG. 13 will be correlated with the parts shown in FIGS. 1 and 2. First, as for the transistors, the drain active region, the gate, and the source active region of the access transistor 1a are the parts 12a, 13a, and 12b, respectively; those of the access transistor 1b are the parts 12d, 13a, and 12e, respectively; those of the driver transistor 2a are the parts 12b, 13b, and 12c, respectively; those of the driver transistor 2b are the parts 12e, 13c, and 12f; those of the load transistor 3a are the parts 12g, 13b, and 12h; and those of the load transistor 3b are the parts 12i, 13c, and 12j. The bit line 4a corresponds to the part 16a, the bit line 4b corresponds to the part 16b, and the word line 5 corresponds to the part 13a. The part 14c in FIG. 1 corresponds to the Vcc interconnection and the parts 16c and 16d in FIG. 2 correspond to the GND interconnection.

Figure 3:
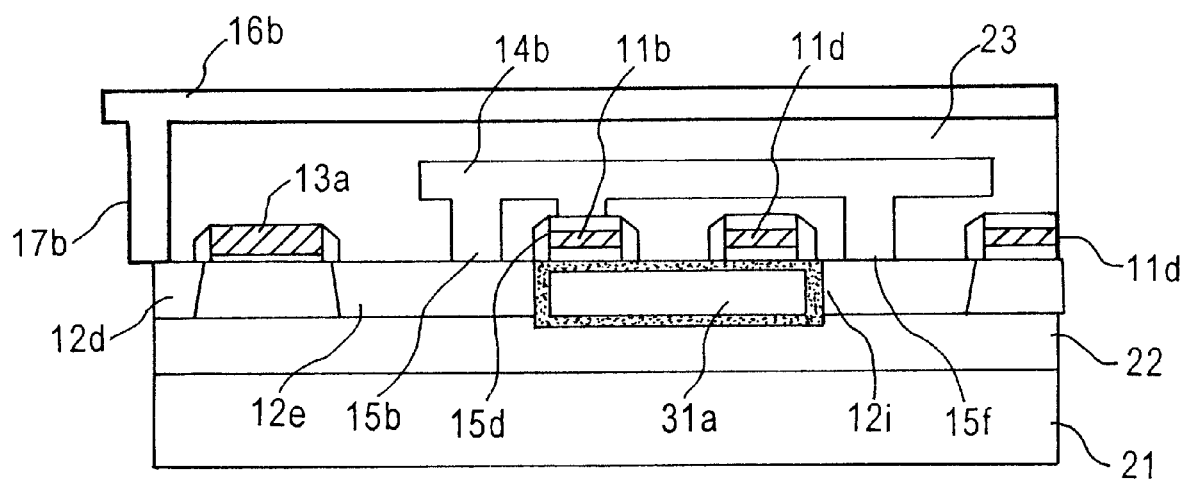
FIG. 3 is a sectional view taken along line I—I in FIGS. 1 and 2.

FIG. 3 is a sectional view taken along line I—I in FIGS. 1 and 2. In FIG. 3, reference symbols 21–23 denote a silicon portion, an insulating layer, and an interlayer insulating film, respectively.

The embodiment 1 is different from the conventional example in that the isolation oxide film 31a (enclosed by a thick-line frame in FIG. 1) provided between the field-shield isolation plate 11b for n-type transistors and the field-shield plate 11d for p-type transistors. This makes it possible to eliminate the floating potential regions in the conventional example.

Further, the embodiment 1 makes it possible to reduce the memory size. Specifically, if each of a minimum polysilicon layer width and a minimum polysilicon interval is W, an interval X between the same storage nodes (see FIG. 1) becomes 3W, which is shorter than the interval X=3W+α in the conventional memory cell by α. The memory cell size can thus be reduced.

Embodiment 2

Figure 4:
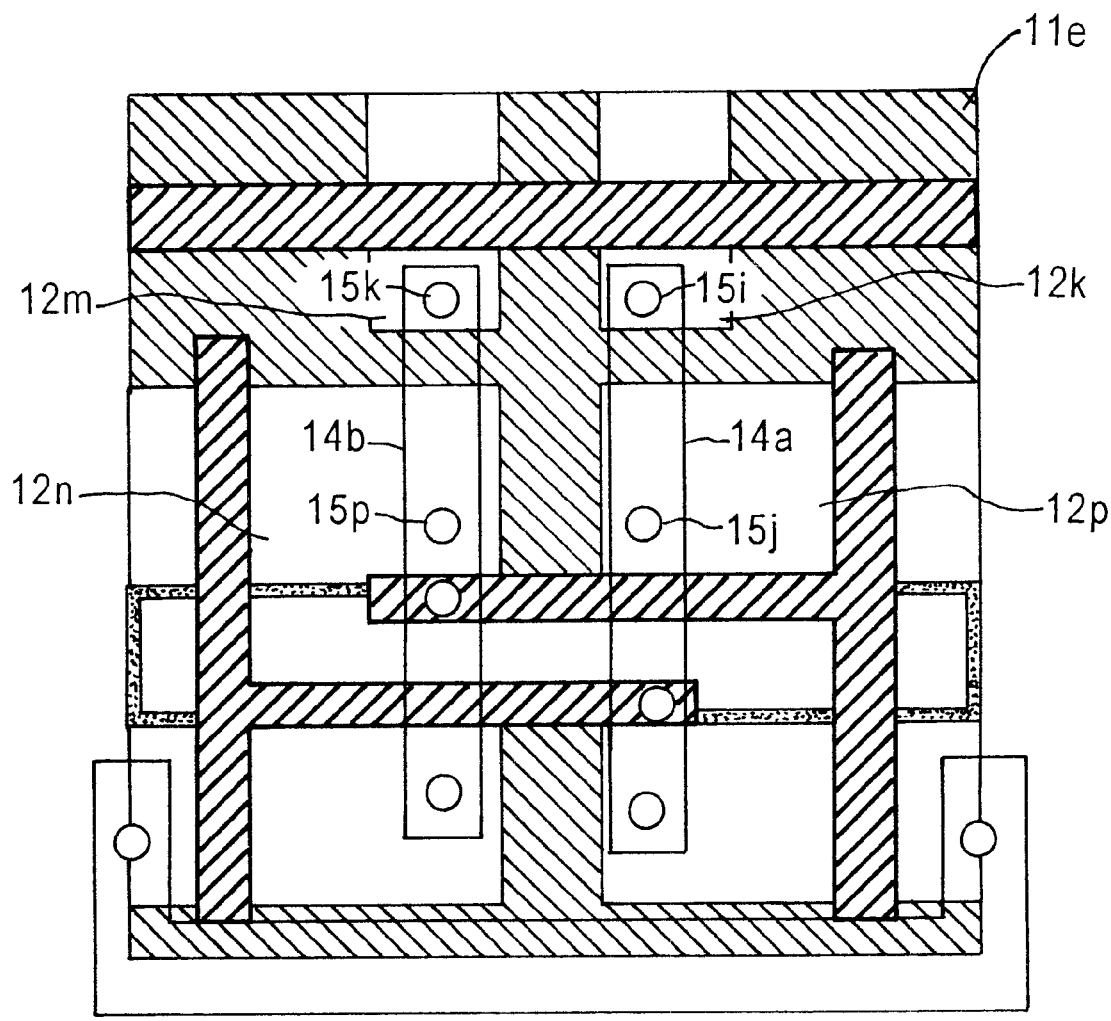
FIG. 4 shows a pattern of an SRAM memory cell according to a embodiment 2 of the invention.

FIG. 4 shows a pattern of an SRAM memory cell according to a embodiment 2 of the invention. Specifically, FIG. 4 shows a pattern of field-shield isolation plates, active regions, polysilicon interconnections, first-level metal interconnections, and first contact portions that connect the first-level metal interconnections to the polysilicon interconnections or the active regions.

The pattern of FIG. 4 is different from the pattern of FIG. 1 (embodiment 1) in the arrangement of the field-shield isolation plates for n-type transistors, the n-type active regions, the first-level metal interconnections, and the first contact portions.

First, the field-shield isolation plates 11a–11c for n-type transistors in FIG. 1 are integrated into a field-shield isolation plate lie in FIG. 4.

Second, as for the n-type active regions, while in FIG. 1 the source active regions of the access transistors 1a and 1b are integrated with the drain active regions of the driver transistors 2a and 2b to form the n-type active regions 12b and 12e, respectively, in FIG. 4 they are divided to form separate active regions for the respective transistors, that is, a source active region 12k of the access transistor 1a, a source active region 12m of the access transistor 1b, a drain active region 12p of the driver transistor 2a, and a drain active region 12n of the driver transistor 2b.

Since the n-type active regions are divided, the patterns of the first-level metal interconnections 14a and 14b are changed, the first contact portion 15a is changed to first contact portions 15i and 15j and the first contact portion 15b is changed to first contact portions 15k and 15p, whereby the access transistors and the driver transistors are connected to each other.

Figure 5:
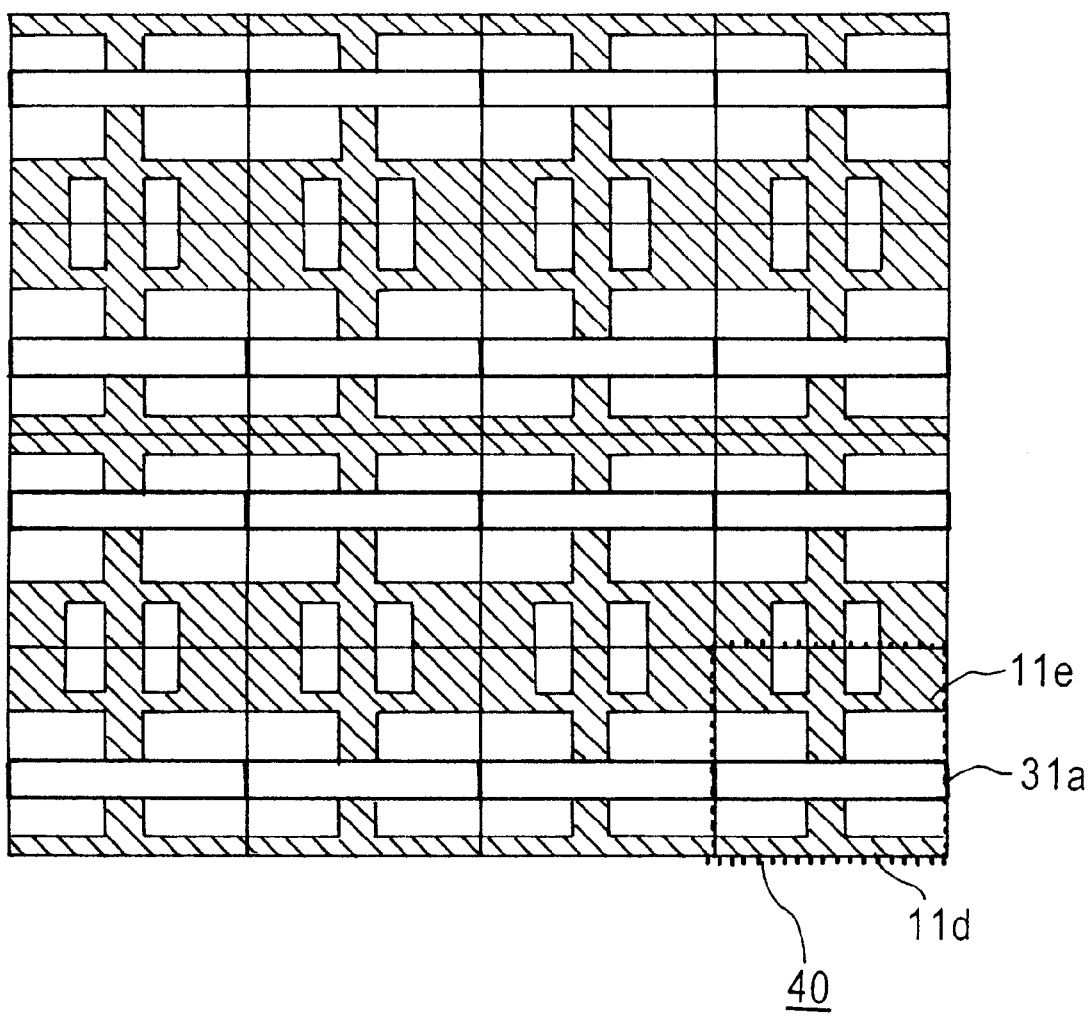
FIG. 5 shows a pattern of field-shield isolation plates in a case where memory cells 40 of this embodiment are arranged in a 4×4 (vertical/horizontal) array.

FIG. 5 shows a pattern of field-shield isolation plates in a case where memory cells 40 of this embodiment are arranged in a 4×4 (vertical/horizontal) array. Where the field-shield isolation plates lie and 11d are arranged in array form, they assume a continuous pattern and hence the plate potentials can be fixed at ends of the array.

Figure 15:
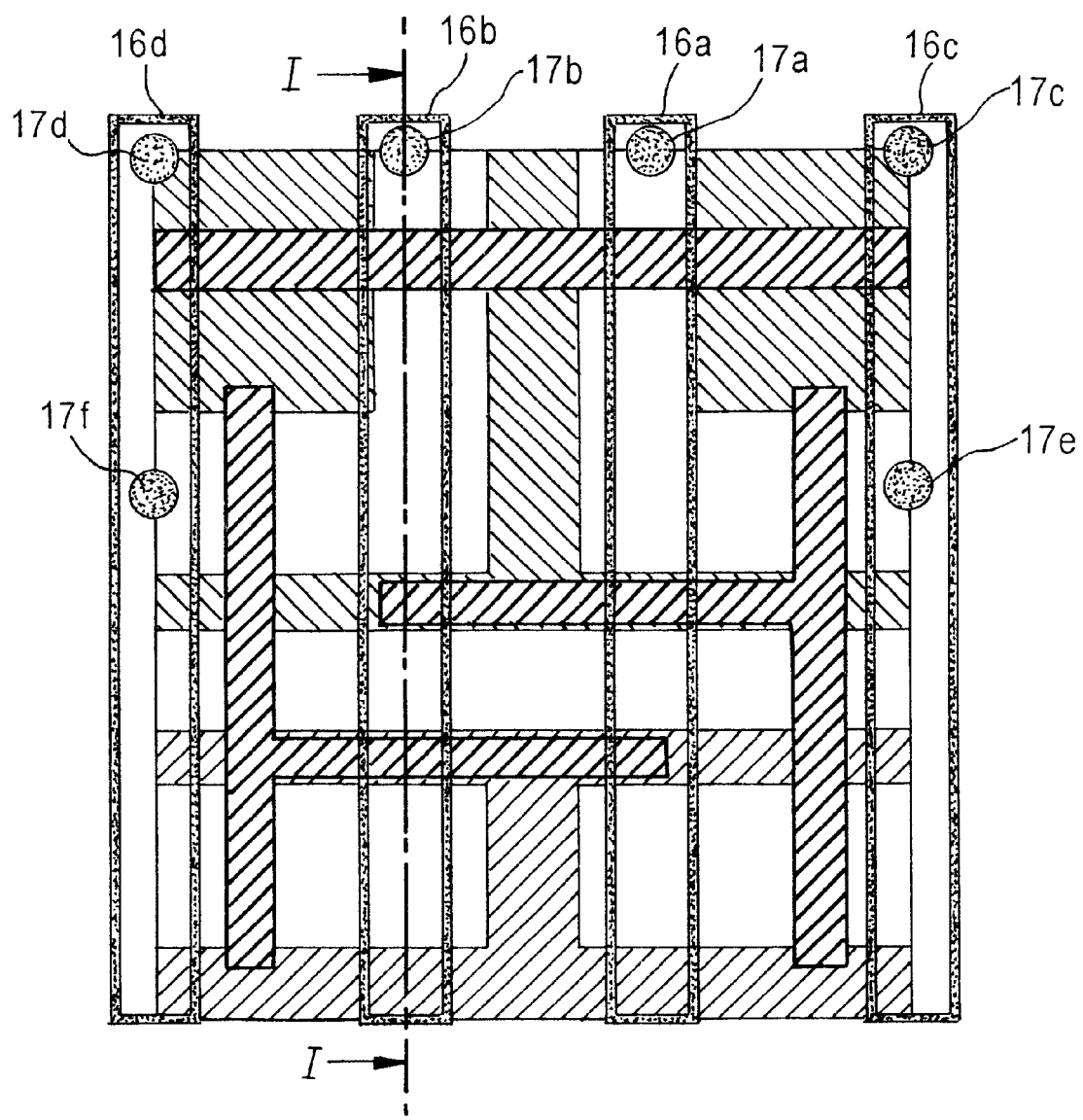
Figure 16:
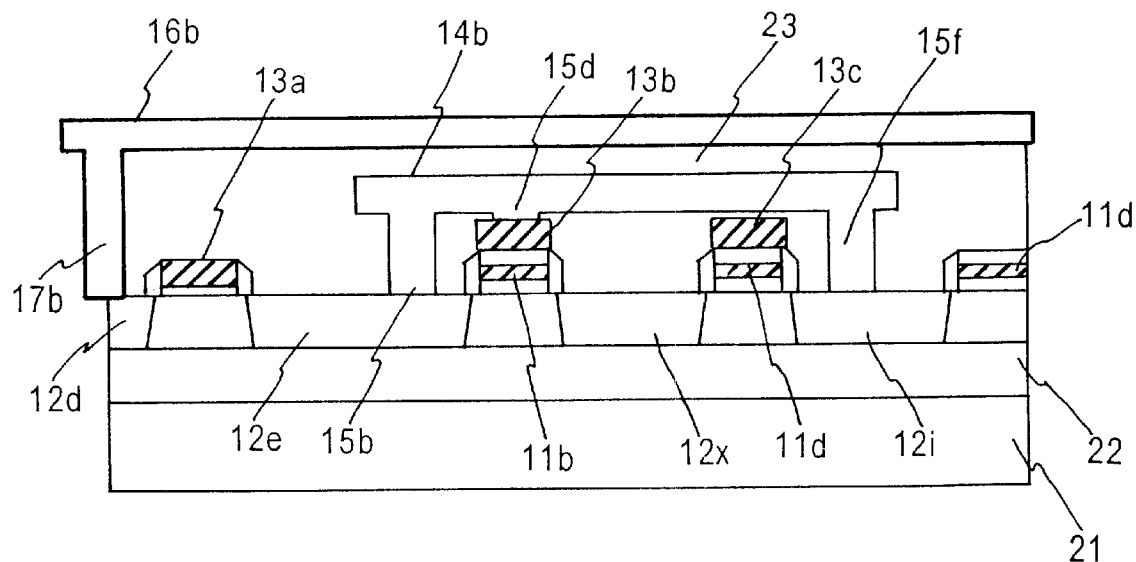
FIG. 16 is a sectional view taken along line I—I in FIGS. 14 and 15.
Figure 17:
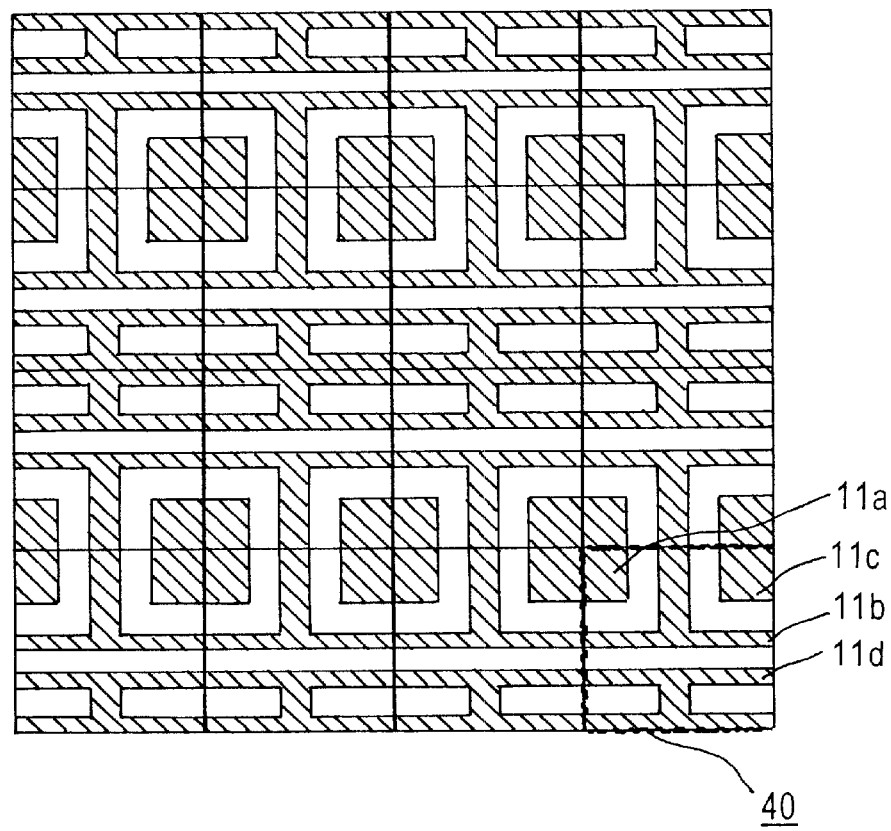
FIG. 17 shows a pattern of field-shield isolation plates in a case where related memory cells 40 as shown in FIGS. 14 and 15 are arranged in a 4×4 (vertical/horizontal) array.

Therefore, unlike the case of the conventional memory cell, it is no longer necessary to fix the plate potentials by means of the second contact portions 17c and 17d that are connected to the field-shield plates (see FIG. 15). As a result, the second contact portions only connect the second-level metal interconnections to the active regions in the memory cell.

Embodiment 3

Figure 6:
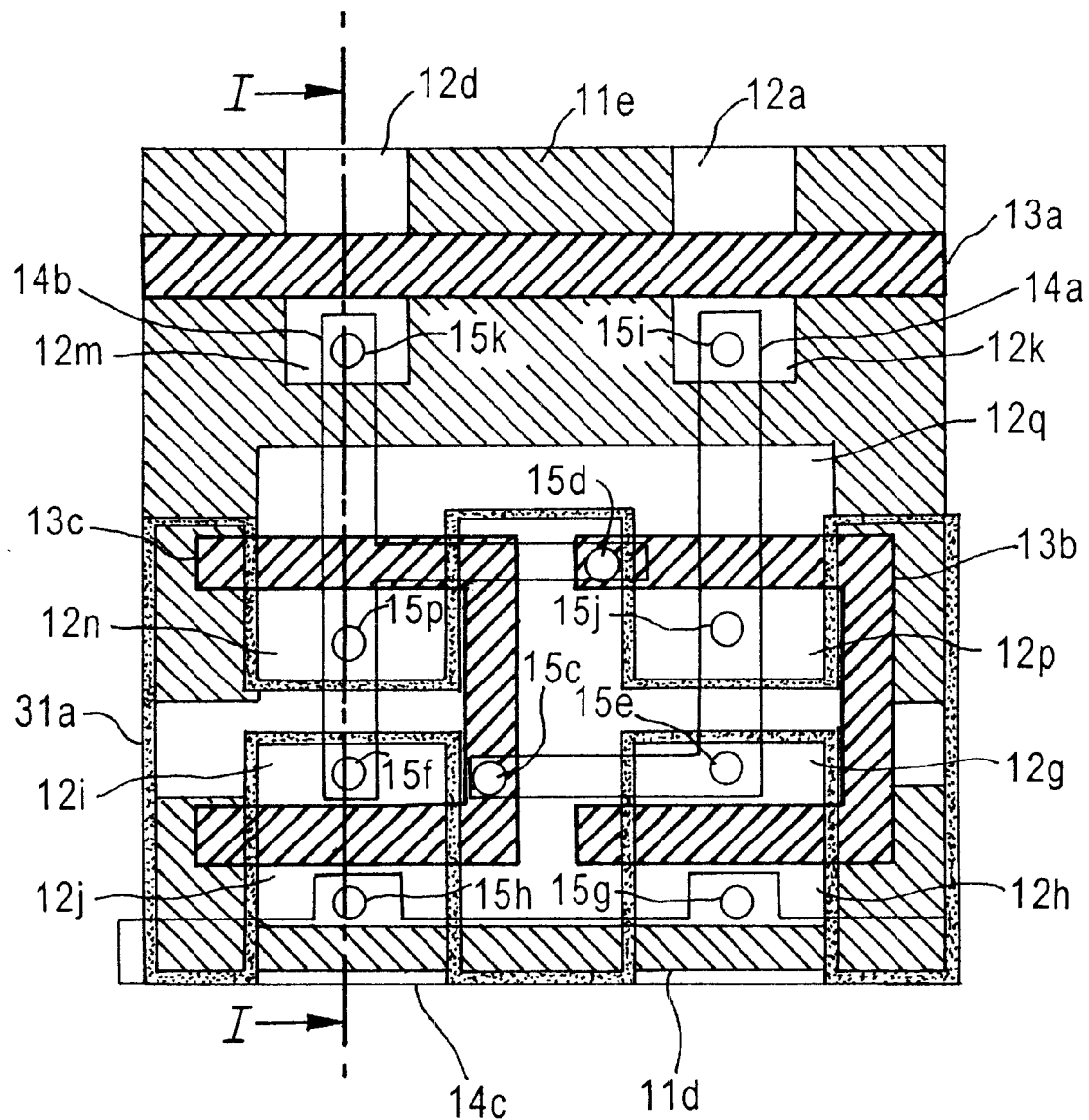
FIGS. 6 and 7 show patterns of an SRAM memory cell according to a embodiment 3 of the present invention.
Figure 7:
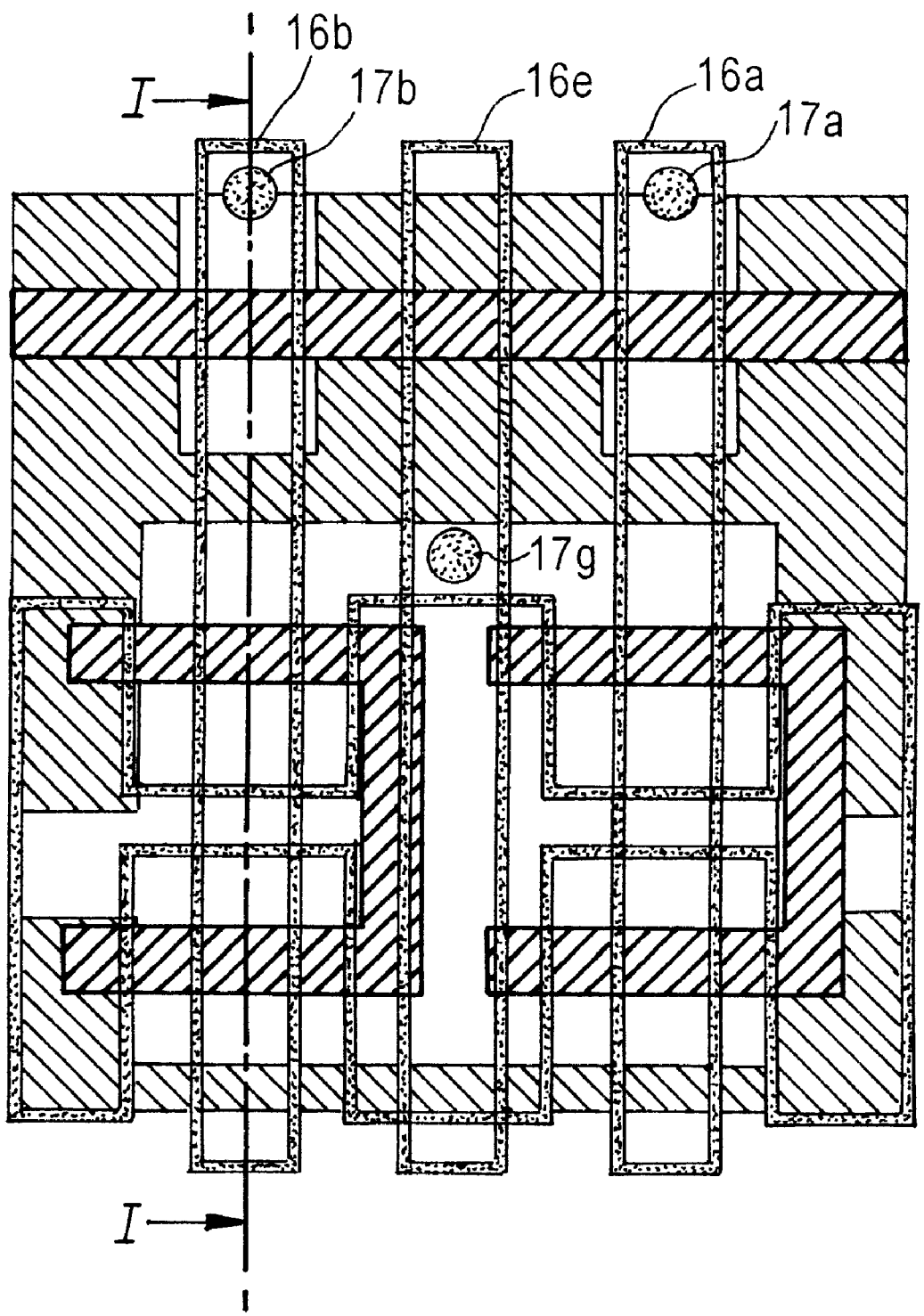

FIGS. 6 and 7 show patterns of an SRAM memory cell according to a embodiment 3 of the present invention. Specifically, FIG. 6 shows a pattern of field-shield isolation plates, active regions, polysilicon interconnections, first-level metal interconnections, and first contact portions that connect the first-level metal interconnections to the polysilicon interconnections or the active regions. FIG. 7 shows a pattern of the field-shield isolation plates, the active regions, the polysilicon interconnections, second-level metal interconnections, and second contact portions that connect the second-level metal interconnections to the active regions.

Figure 8:
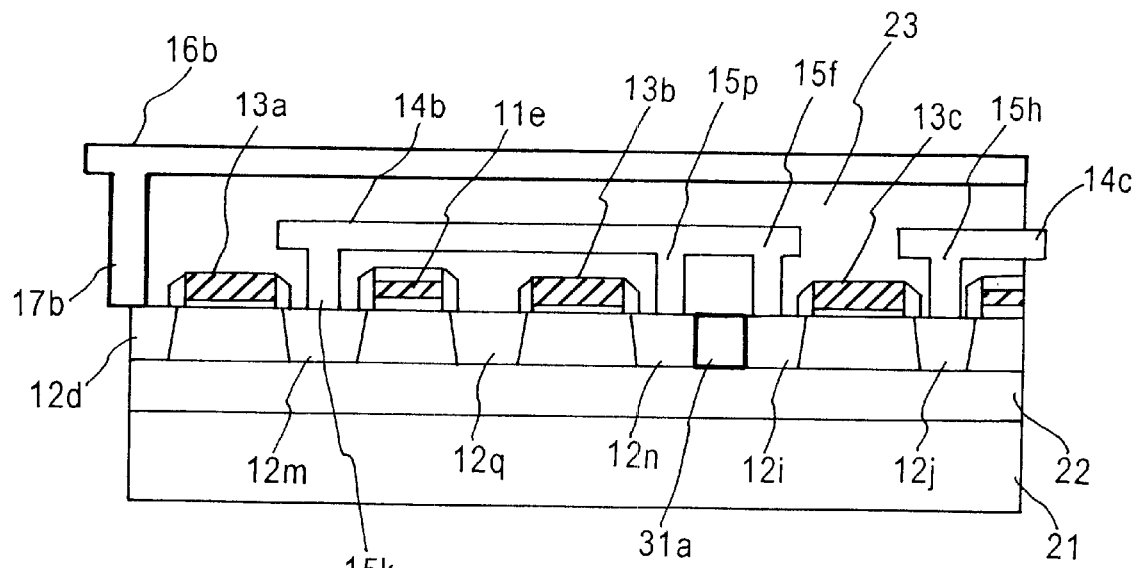
FIG. 8 is a sectional view taken along line I—I in FIGS. 6 and 7.

FIG. 8 is a sectional view taken along line I—I in FIGS. 6 and 7.

The same reference symbols in FIGS. 6–8 (this embodiment) and FIGS. 1–4 (first and embodiment 2s) denote the same or corresponding parts.

A large difference between this embodiment and the first and embodiment 2s is the direction of part of the polysilicon interconnections that serve as the gates of the driver and load transistors. That is, while in the first and embodiment 2s those polysilicon interconnections are substantially perpendicular to the polysilicon interconnection 13a that serves as the gates of the access transistors, in this embodiment the former are substantially parallel with the latter. This greatly changes the pattern of the isolation oxide film 31a. Further, the source active regions 12c and 12f of the driver transistor in the embodiments 1 and 2 are combined into a source active region 12q. Still further, while in the first and embodiment 2s the GND lines 16c and 16d are located at the two side positions of the memory cell (see FIG. 2), in this embodiment a GND line 16e is located at a central position of the memory cell (see FIG. 7).

This embodiment provides the same effects as the first and embodiment 2; that is, the floating potential active regions can be eliminated, the memory cell size can be reduced, and the number of kinds of second contact portions can be reduced to one.

Further, since the GND interconnection 16e is located between the bit lines 16a and 16b in the memory cell, inter-bit-line noise in the memory cell can be reduced.

Embodiment 4

Figure 9:
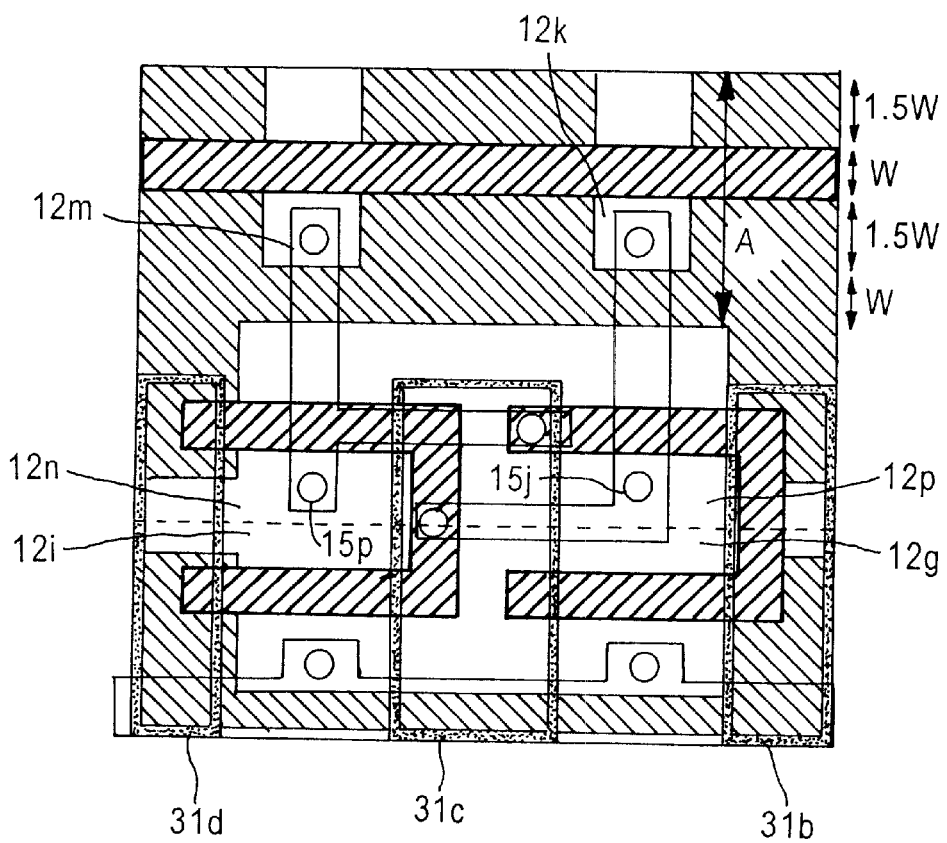
FIG. 9 shows a pattern of an SRAM memory cell according to a embodiment 4 of the invention.

FIG. 9 shows a pattern of an SRAM memory cell according to a embodiment 4 of the invention. Specifically, FIG. 9 shows a pattern of field-shield isolation plates, active regions, polysilicon interconnections, first-level metal interconnections, and first contact portions that connect the first-level metal interconnections to the polysilicon interconnections or the active regions.

This embodiment is different from the embodiment 3 in the pattern of isolation oxide films. In the embodiment 3, the isolation oxide film 31a is continuous and have protrusions and recesses in a plane as shown in FIG. 6. In contrast, in this embodiment, three separate isolation oxide films 31b–31d are provided as shown in FIG. 9. In this connection, the n-type active regions 12p and 12n are in contact with the p-type active regions 12g and 12i, respectively.

As described in the conventional example, in SOI devices surface portions of active regions are usually converted to a refractory metal silicide. Therefore, even if an n-type active region and a p-type active region are in contact with each other, no PN junction is formed on the surface and no problems occur.

In this embodiment, there is no isolation oxide film that is interposed between an n-type active region and a p-type active region and hence the memory cell size can further be reduced.

Embodiment 5

Figure 10:
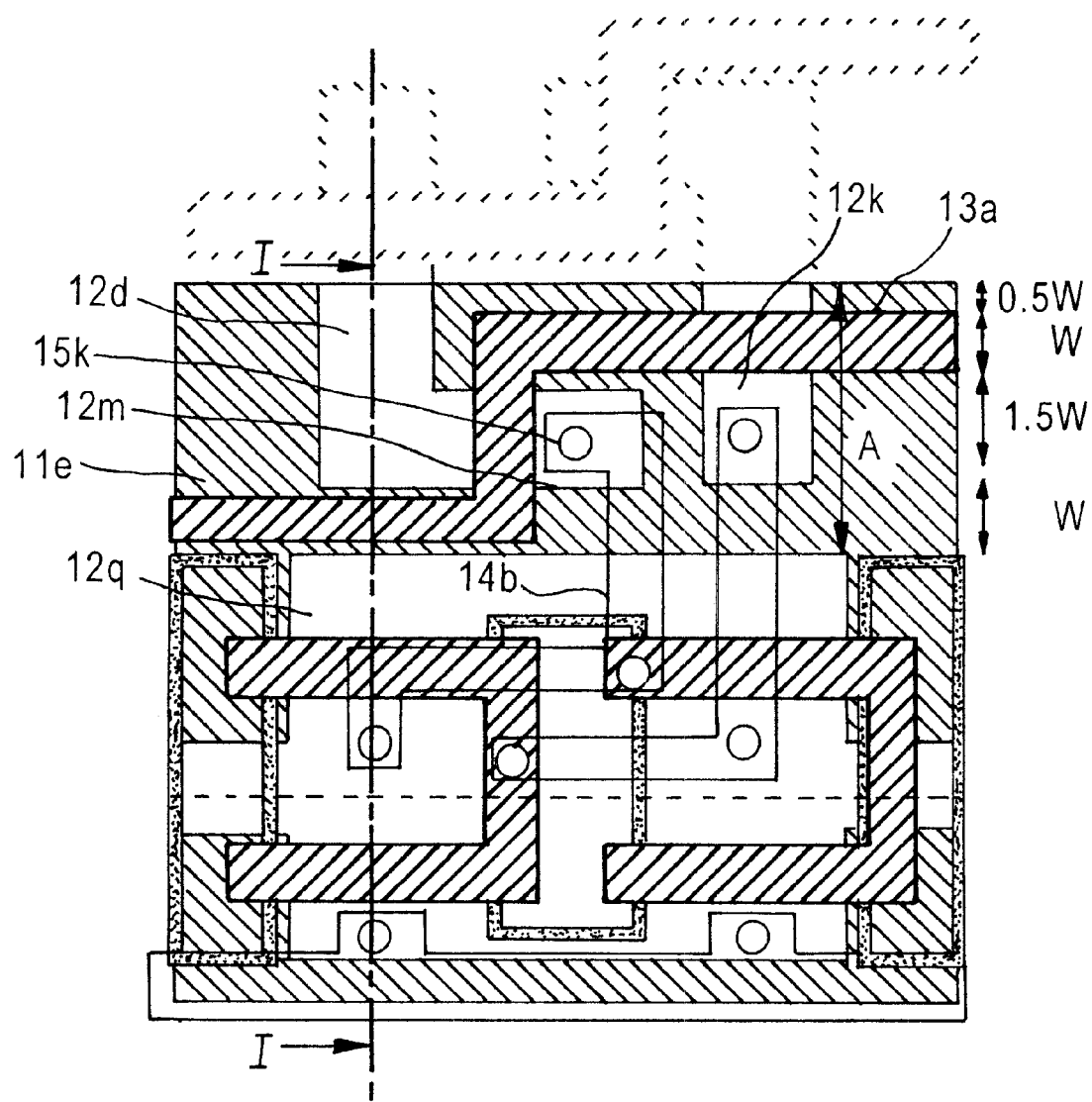
FIGS. 10 and 11 show patterns of an SRAM memory cell according to a embodiment 5 of the invention.
Figure 11:
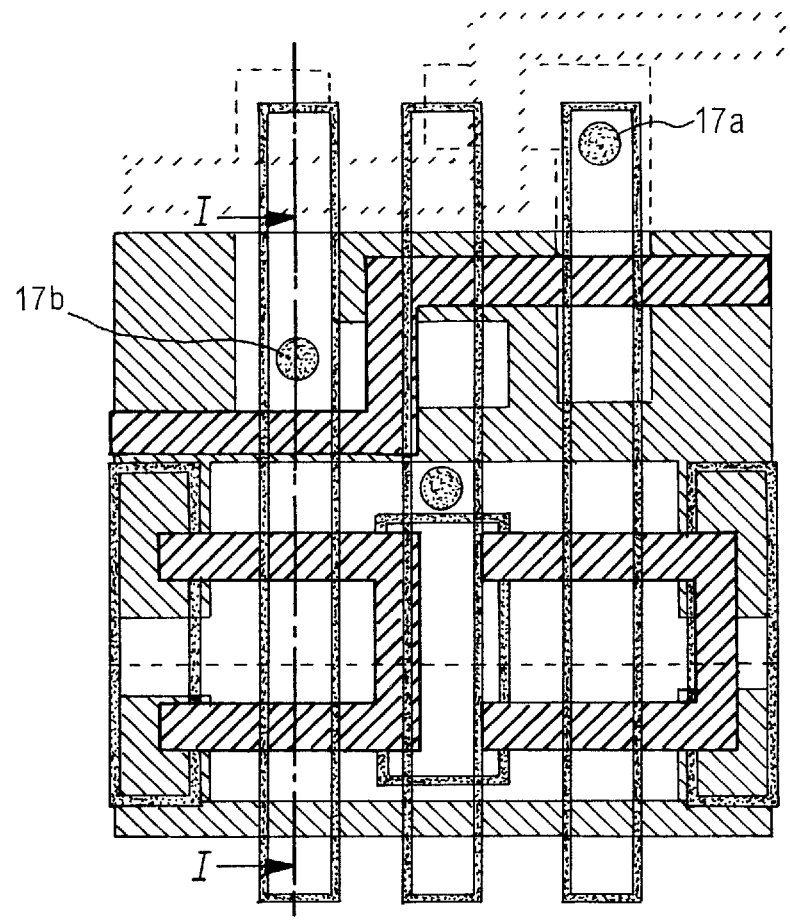

FIGS. 10 and 11 show patterns of an SRAM memory cell according to a embodiment 5 of the invention. This embodiment is different from the embodiment 4 in that the arrangement of the active regions of the access transistor 1b is changed and the word line is of a bent shape rather than a straight shape.

In the embodiment 4, the field-shield isolation width between the n-type active regions 12k and 12m is wide as shown in FIG. 9. In this embodiment, this portion is used as an n-type active region, whereby the memory cell area is effectively utilized and the memory cell size is reduced.

With this measure, as shown in FIG. 10, the drain active region 12d and the source active region 12m of the access transistor 1b and the source active region 12k of the access transistor 1a are arranged approximately on a straight line. Since the word line 13a runs on the portion of the field-shield isolation plate that is located between the drain active region 12d of the access transistor 1b and the source active region 12q of the driver transistors, it assumes a bent shape (see FIG. 10) rather than a straight shape (see FIG. 9).

Next, a description will be made of a specific memory cell size reduction effect. Here, a length A between a memory cell boundary and an end of the source active regions of the driver transistors in the memory cell of FIG. 9 is compared with that in the memory cell of FIG. 10. The other portions have the same length in the two embodiments. With an assumption that the access transistors have a gate length W, a gate width 1.5W, and a minimum isolation width W, the length A is equal to 5W in the embodiment 4 as shown in FIG. 9. In contrast, in this embodiment, the length A is equal to 4W as shown in FIG. 10. The shortening of the length A leads to memory size reduction.

Broken line patterns in the top portion of FIG. 10 are active regions of access transistors and a word line in an adjacent memory cell that are point-symmetrical symmetrical with the active regions the access transistors and the word line in the memory cell concerned.

Figure 12:
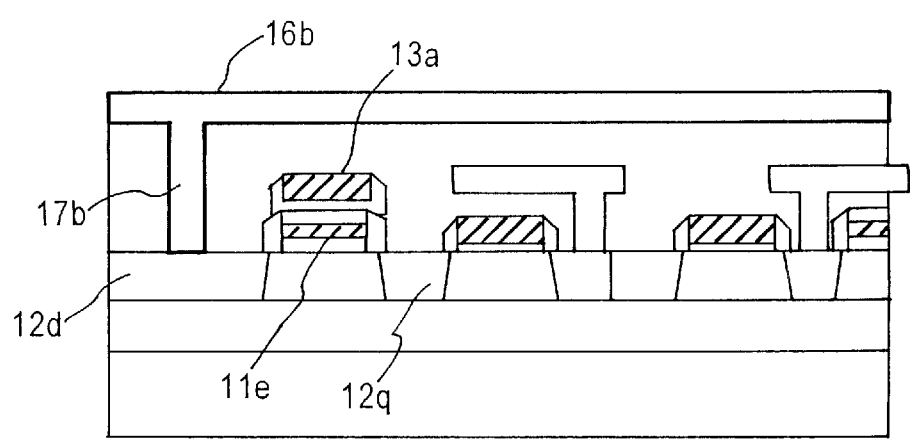
FIG. 12 is a sectional view taken along line I—I in FIGS. 9 and 10.

FIG. 12 is a sectional view taken along line I—I in FIGS. 9 and 10.

In the first to third and embodiment 5s, the SOI substrate can be replaced by an ordinary silicon substrate.

Although the oxide film isolation in the first to embodiment 5s generally means isolation using a silicon oxide film such as LOCOS isolation and trench isolation, it may be in any form as long as active regions can be isolated from each other by using an insulating film.

Having the above constitution, the invention provides the following advantages.

According to the first and second aspects of the invention, the memory cell size can be reduced by combining field-shield isolation and oxide film isolation to effect isolation through enclosure of the active regions of the driver transistors and the active regions of the load transistors.

In the semiconductor storage device, the drain active region of the first driver transistor and the drain active region of the first load transistor may be in contact with each other, and the drain active region of the second driver transistor and the drain active region of the second load transistor may be in contact with each other. In the semiconductor storage device, the memory cell size can further be reduced by bringing the drain active regions of the driver transistors in contact with the drain active regions of the load transistors, respectively.

According to the third aspect of the invention, since the source active regions of the access transistors are isolated from the drain active regions of the driver transistors, respectively, by field-shield isolation, solitary isolation regions are eliminated. Therefore, the fourth aspect of the invention dispenses with second contact portions to be connected to the field-shield isolation plates in the memory cell and facilitates hole formation of the second contact portions.

According to the fourth aspect of the invention, the memory cell size can further be reduced by arranging the drain active region and the source active region of the first access transistor and the source active region of the second access transistor substantially on a straight line.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 10-304027 filed on Oct. 26, 1998 including specification, claims, drawings and summary are incorporated herein by reference in its entirety.

What is claimed is:

1. A semiconductor storage device having a memory cell including device isolation, comprising:

a first driver transistor;

a second driver transistor;

a first and a second load transistors that form a flip-flop circuit together with said first and said second driver transistors;

a first access transistor connected to a drain active region of said first driver transistor and a drain active region of said first load transistor;

a second access transistor connected to a drain active region of said second driver transistor and a drain active region of said second load transistor;

wherein said device isolation in said memory cell includes field-shield isolation, the field-shield isolation is located between said first access transistor and said second access transistor, and between the drain active region of said first driver transistor and the drain active region of said second driver transistor, and between the drain active region of said first load transistor and the drain active region of said second load transistor;

and oxide film isolation, the oxide film isolation is located between the drain active region of said first driver transistor and the drain active region of said first load transistor, and between the drain active region of said second driver transistor and the drain active region of said second load transistor, is in contact with each drain active region.

2. The semiconductor storage device according to claim 1, further comprising:

a pattern being integrated with and being the same conductive layer with a gate electrode of said first driver transistor and said first load transistor, and being located on the oxide film isolation, and being connected to a wire connected to the drain active region of said second driver transistor and said second load transistor; and a pattern being integrated with and being the same conductive layer with a gate electrode of said second driver transistor and said second load transistor, and being located on the oxide film isolation, and being connected to a wire connected to the drain active region of said first driver transistor and said first load transistor.

3. A semiconductor storage device having a memory cell including device isolation, comprising:

a first driver transistor;

a second driver transistor;

a first and a second load transistors that form a flip-flop circuit together with said first and said second driver transistors;

a first access transistor connected to a drain active region of said first driver transistor and a drain active region of said first load transistor; and a second access transistor connected to a drain active region of said second driver transistor and a drain active region of said second load transistor, wherein said device isolation in said memory cell includes field-shield isolation, active regions of said first access transistor and the drain active region of said first driver transistor are isolated from each other by a first field-shield isolation and connected to each other via an interconnection, and active regions of said second access transistor and the drain active region of said second driver transistor are isolated from each other by a second field-shield isolation and connected to each other via an interconnection, the first field-shield isolation and the second field shield isolation are a continuous and integrated pattern.

4. The semiconductor storage device according to claim 3, wherein said driver transistors and said load transistors are isolated from each other by oxide film isolation.

* * * * *